United States Patent
Shinkai et al.

(10) Patent No.: US 12,300,587 B2
(45) Date of Patent: May 13, 2025

(54) ELECTRONIC COMPONENT MODULE

(71) Applicant: Murata Manufacturing Co., Ltd., Nagaokakyo (JP)

(72) Inventors: Hideki Shinkai, Nagaokakyo (JP); Akio Katsube, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 475 days.

(21) Appl. No.: 17/643,672

(22) Filed: Dec. 10, 2021

(65) Prior Publication Data

US 2022/0102255 A1 Mar. 31, 2022

Related U.S. Application Data

(63) Continuation of application No. PCT/JP2020/023431, filed on Jun. 15, 2020.

(30) Foreign Application Priority Data

Jun. 27, 2019 (JP) .................................. 2019-119279

(51) Int. Cl.
*H01L 23/66* (2006.01)
*H01L 23/31* (2006.01)
(Continued)

(52) U.S. Cl.
CPC .... *H01L 23/49811* (2013.01); *H01L 23/3135* (2013.01); *H01L 23/66* (2013.01);
(Continued)

(58) Field of Classification Search
CPC . H01L 23/49811; H01L 23/66; H01L 23/315; H01L 23/552
See application file for complete search history.

(56) References Cited

U.S. PATENT DOCUMENTS

| | | |
|---|---|---|
| 2017/0250120 A1 | 8/2017 | Harauchi et al. |
| 2018/0033738 A1 | 2/2018 | Kawabata et al. |

(Continued)

FOREIGN PATENT DOCUMENTS

| | | |
|---|---|---|
| JP | F08-330782 A | 12/1996 |
| JP | 2017-073521 A | 4/2017 |

(Continued)

OTHER PUBLICATIONS

International Search Report for International Patent Application No. PCT/JP2020/023431 dated Sep. 1, 2020.

*Primary Examiner* — Michele Fan
(74) *Attorney, Agent, or Firm* — McDonald Hopkins LLC

(57) ABSTRACT

An electronic component module includes a substrate, a connector, an electronic component, a conductor wall, an insulating resin, and a conductive shield film. The connector and the electronic component are mounted on a first main surface of the substrate. The conductor wall has a cylindrical shape, is mounted on the first main surface of the substrate, and includes an interior space in which the connector is disposed. The insulating resin is provided on the first main surface. The conductive shield film is provided on a surface of the insulating resin. The insulating resin covers the electronic component and is disposed outside the conductor wall except the interior space of the conductor wall.

15 Claims, 12 Drawing Sheets

(51) Int. Cl.
    *H01L 23/498*     (2006.01)
    *H01L 25/16*     (2023.01)
    *H01L 23/29*     (2006.01)

(52) U.S. Cl.
    CPC .......... *H01L 25/165* (2013.01); *H01L 23/293* (2013.01); *H01L 2223/6677* (2013.01)

(56) References Cited

U.S. PATENT DOCUMENTS

| | | | |
|---|---|---|---|
| 2018/0134546 A1* | 5/2018 | Oh | H01L 23/315 |
| 2018/0159216 A1 | 6/2018 | Kai et al. | |
| 2019/0287953 A1* | 9/2019 | Moon | H01L 23/552 |

FOREIGN PATENT DOCUMENTS

| | | |
|---|---|---|
| JP | 2018-018867 A | 2/2018 |
| JP | 2018-093014 A | 6/2018 |
| WO | 2016/031807 A1 | 3/2016 |

\* cited by examiner

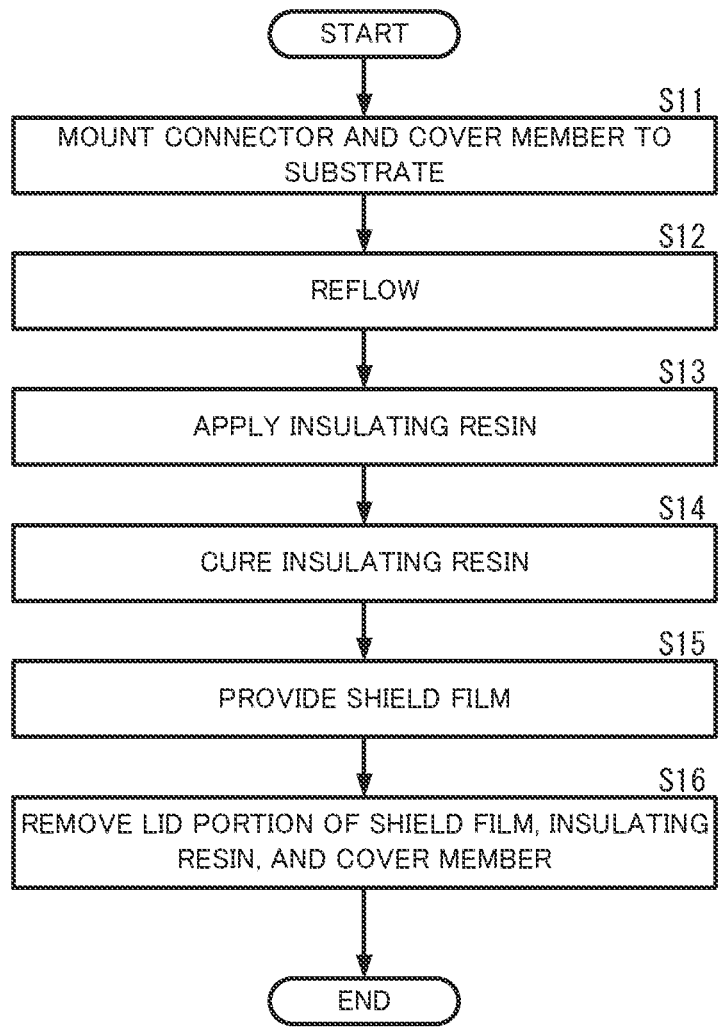

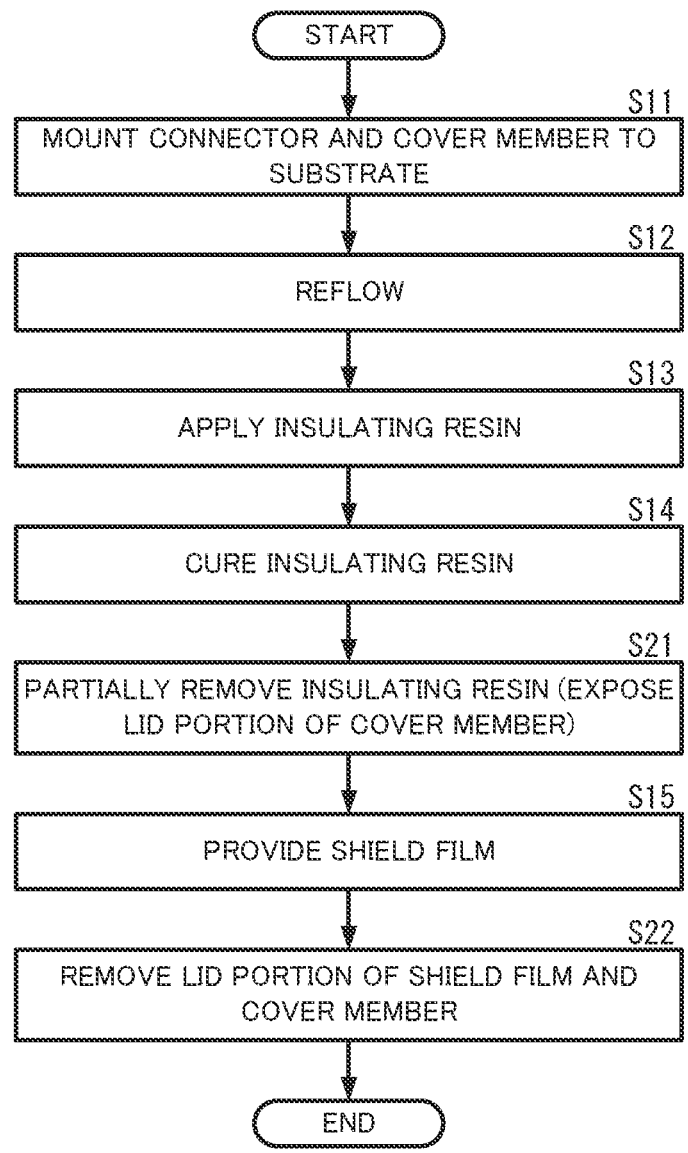

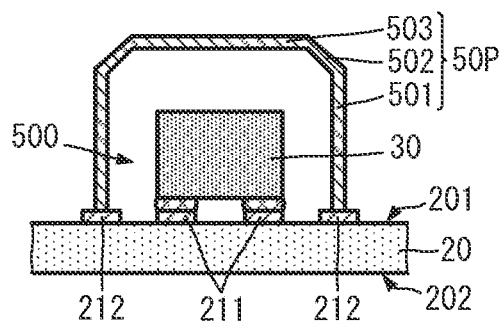
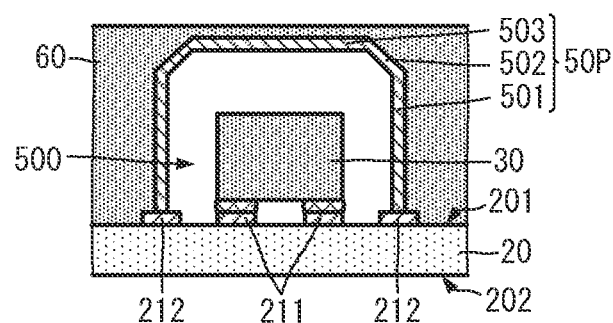
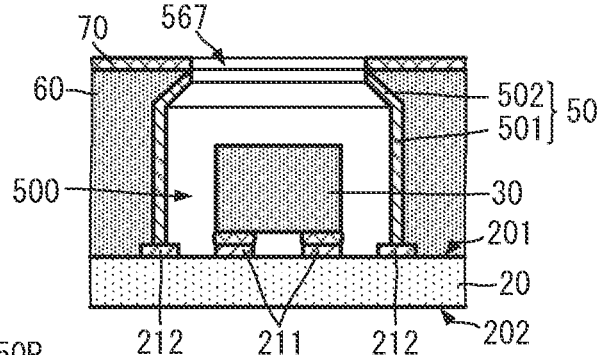
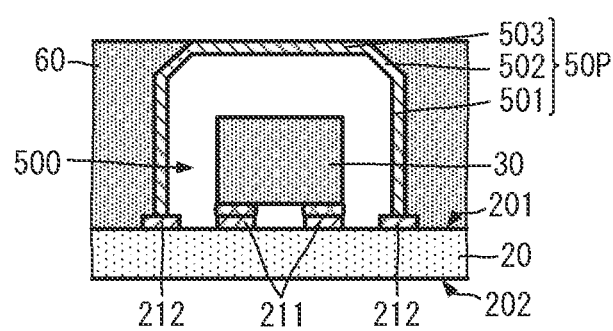
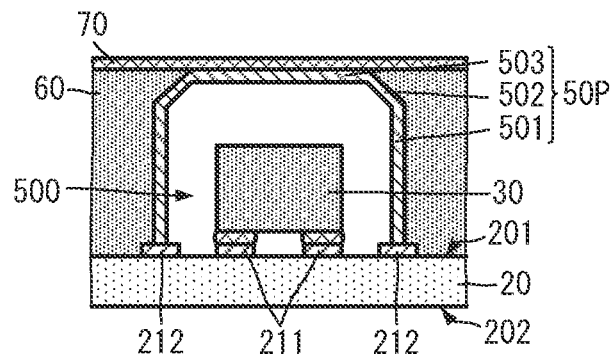

ELECTRONIC COMPONENT MODULE

CROSS REFERENCE TO RELATED APPLICATION

This is a continuation of International Application No. PCT/JP2020/23431 filed on Jun. 15, 2020 which claims priority from Japanese Patent Application No. 2019-119279 filed on Jun. 27, 2019. The contents of these applications are incorporated herein by reference in their entireties.

TECHNICAL FIELD

The present disclosure relates to an electronic component module in which an electronic component is mounted on a substrate.

DESCRIPTION OF THE RELATED ART

Patent Literature 1 discloses a wireless module The wireless module disclosed in Patent Literature 1 includes a substrate, an electronic component, a resin layer, and a shield layer.

The electronic component is mounted on the substrate and covered with the resin layer. The resin layer covers a portion of a surface on which the electronic component on the substrate is mounted. The shield layer covers a surface of the resin layer.

CITATION LIST

Patent Literature

Patent Literature 1: Japanese Unexamined Patent Application Publication No. 2018-093014

BRIEF SUMMARY

Technical Problem

In an electronic component module such as a wireless module disclosed in Patent Literature 1, a mount component that is not covered with a resin layer such as a connector may be used as a component to be mounted on a substrate. On the other hand, an electronic component such as an IC is preferably covered with a resin layer for protection or any other use.

However, in a case in which the electronic component that is covered with the resin layer is disposed around the mount component that is not covered with the resin layer, it has not been easy to achieve a structure in which both the electronic component and the mount component are disposed. When the electronic component module is small in particular, a distance between the mount component and the electronic component is small. Therefore, it has not been even easier to achieve a structure in which the mount component is not covered with the resin layer while the electronic component is covered with the resin layer.

Therefore, embodiments of the present disclosure provide an electronic component module that can easily achieve a structure in which both a mount component that is not covered with a resin layer and an electronic component such as an IC that is covered with a resin layer are disposed on the same surface of a substrate.

Solution to Problem

An electronic component module of the present disclosure includes a substrate, an electronic component, a mount component, an insulating resin, and a conductive shield film. The electronic component is mounted on a first main surface of the substrate. The mount component is mounted on the first main surface of the substrate. The conductor wall has a cylindrical shape, is mounted on the first main surface of the substrate, and has an interior space in which the mount component is disposed. The insulating resin is provided on the first main surface. The conductive shield film is provided on a surface of the insulating resin. The insulating resin has an opening portion, the mount component is disposed in the opening portion, and the opening portion includes a conductor wall.

In this configuration, the mount component and the electronic component are separated by the conductor wall into different spaces on the first main surface. Therefore, it is easy not to cover the mount component with the insulating resin and to cover the electronic component with the insulating resin.

Advantageous Effects

According to the present disclosure, a structure in which both of an electronic component that is covered with a resin layer and a mount component that is not covered with a resin layer are disposed on the same surface is able to be easily achieved.

BRIEF DESCRIPTION OF DRAWINGS

FIG. 3 is a flow chart showing a method of manufacturing the electronic component module according to the first embodiment of the present disclosure.

FIG. 7 is a flow chart showing a method of manufacturing the electronic component module according to the second embodiment.

FIG. 8A, FIG. 8B, FIG. 8C, FIG. 8D, and FIG. 8E are enlarged views of a side cross-section showing a shape in which a connector is located in predetermined steps of a manufacturing method shown in FIG. 7.

DESCRIPTION OF EMBODIMENTS

First Embodiment

Figure 1A:
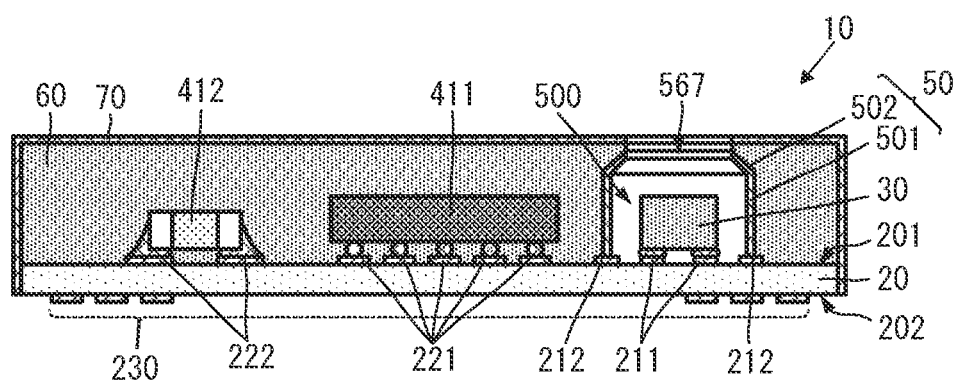
FIG. 1A is a side cross-sectional view showing a configuration of an electronic component module according to a first embodiment of the present disclosure.
Figure 1B:
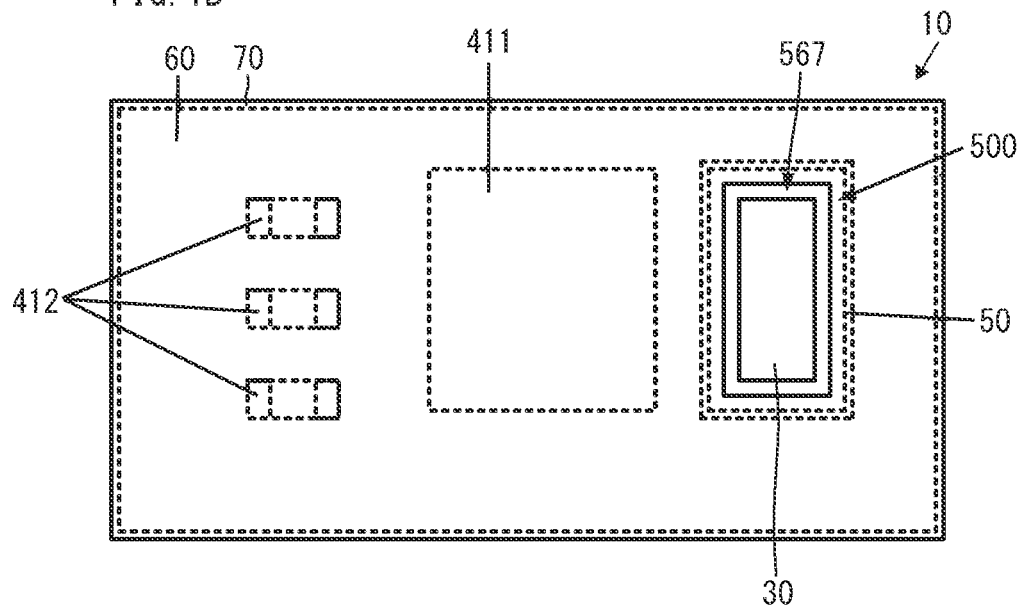
FIG. 1B is a plan view showing the configuration of the electronic component module according to the first embodiment.

An electronic component module according to a first embodiment of the present disclosure will be described with reference to drawings. FIG. 1A is a side cross-sectional view showing a configuration of the electronic component module according to the first embodiment. FIG. 1B is a plan view showing the configuration of the electronic component module according to the first embodiment.

[Configuration of Electronic Component Module 10]

As shown in FIG. 1A and FIG. 1B, an electronic component module 10 includes a substrate 20, a connector 30, an electronic component 411, an electronic component 412, a conductor wall 50, an insulating resin 60, and a shield film 70.

The substrate 20 has an insulating main body and includes a conductor pattern to achieve the electronic component module 10. The substrate 20 is a rectangular or substantially rectangular flat plate and has a first main surface 201 and a second main surface 202 that face each other.

A land conductor 211, a land conductor 212, a land conductor 221, and a land conductor 222 are provided on the first main surface 201 of the substrate 20. The number of land conductors 211, land conductors 212, land conductors 221, and land conductors 222 correspond to the number of components mounted to each land conductor. The land conductor 212 is disposed so as to surround the land conductor 211.

An antenna conductor 230 is provided on the second main surface 202 of the substrate 20. The antenna conductor 230 is a winding shaped conductor having an area over the substantially entire second main surface 202 of the substrate 20, for example.

The connector 30 is mounted on the land conductor 211. The connector 30 is disposed so that a connection surface to be connected to an outside may be on a side opposite to the substrate 20. The connector 30 is a "mount component" of the present disclosure.

The electronic component 411 is mounted on the land conductor 221. The electronic component 412 is mounted on the land conductor 222. The electronic component 411 may be an IC or the like, for example, and the electronic component 412 may be a chip component such as a resistor, a capacitor, an inductor, or the like, for example. While the electronic component 411 and the electronic component 412 correspond to an "electronic component" of the present disclosure, only the electronic component 411 may be defined as the "electronic component" of the present disclosure.

The conductor wall 50 is mounted on the land conductor 212. The conductor wall 50 is made of a metal such as copper (Cu), for example. The conductor wall 50 has a cylindrical shape, and includes an interior space 500. The conductor wall 50 includes a main portion 501 and an end portion 502. The main portion 501 and the end portion 502 are integrally provided. The end portion 502 is connected to one end of the main portion 501 in an extending direction in which the cylindrical shape extends.

The main portion 501 has the same cross-sectional area at all positions in the extending direction. The end portion 502 has a shape in which the cross-sectional area is gradually reduced from an end to be connected to the main portion 501 in the extending direction. In other words, in the cylindrical conductor wall 50, an opening area on a side opposite to a side to be mounted on the substrate 20 is smaller than a planar cross-sectional area at the same height as the mount component. In such a case, the center of the cross-sectional shape of the end portion 502 substantially coincides with the center of the cross-sectional shape of the main portion 501. In other words, the end portion 502 is shaped to be gradually reduced from the end near the main portion 501. In addition, a position on the wall at the end (an opening portion of the conductor wall 50) of the end portion 502 opposite to the main portion 501 is closer to the center of the interior space than a position on the wall of the main portion 501.

The cross-sectional area of the end portion 502 on a side opposite to a side to be connected to the main portion 501, that is, an area (an opening area) of the opening near the end portion 502 of the conductor wall 50 is set according to a shape of another connector member to be connected to the connector 30.

The conductor wall 50 is mounted on the land conductor 212 at an end of the main portion 501 opposite to a side to be connected to the end portion 502.

The height (a length in a direction in which the cylindrical shape extends) of the conductor wall 50 is larger than the height of the connector 30. The height (the length in the direction in which the cylindrical shape extends) of the main portion 501 may be larger than the height of the connector 30. Accordingly, the connector 30 is disposed in a space (the interior space 500) surrounded by the conductor wall 50.

The insulating resin 60 is provided on a side of the first main surface 201 of the substrate 20. The insulating resin 60 covers the electronic component 411 and the electronic component 412. As a result, the electronic component 411 and the electronic component 412 are protected by the insulating resin 60.

The insulating resin 60 is in contact with the outer surface of the conductor wall 50, and is not provided in the space surrounded with the conductor wall 50. As a result, the connector 30 is not covered with the insulating resin 60.

Then, the insulating resin 60 covers the entire first main surface 201 except the interior space of the conductor wall 50. In such a case, the insulating resin 60 does not cover an opening surface near the end portion 502 of the conductor wall 50. As a result, the first main surface 201 other than (other than a position at which the connector 30 is mounted) the interior space of the conductor wall 50 is protected.

The shield film 70 has conductivity. The shield film 70 is provided on a surface of the insulating resin 60. The shield film 70 is connected to a ground conductor pattern of the substrate 20, for example.

In such a case, the shield film 70 does not cover the opening surface near the end portion 502 of the conductor wall 50. As a result, the electronic component module 10 includes an opening 567 through which the connection surface of the connector 30 is visible from the outside.

According to such a configuration, the electronic component module 10 is able to cover the electronic component 411 and the electronic component 412 by the insulating resin 60 and the shield film 70 and connect the connector 30 to an external connector member while mounting the connector 30, the electronic component 411, and the electronic component 412 on the same surface of the substrate 20.

Furthermore, the electronic component module 10 is able to reliably and easily install the conductor wall 50 in a desired position between the electronic component 411 and the electronic component 412, and the connector 30 by including the conductor wall 50 mounted on the substrate 20. For example, even when the size of the electronic component module 10 is reduced and thus a space between the electronic component 411 and the connectors 30 is reduced, the conductor wall 50 is able to be reliably and easily installed in the space.

In addition, the electronic component module 10 is able to significantly reduce or prevent the connector 30 from being covered with the insulating resin by the conductor wall 50 when the insulating resin 60 is provided. In particular, the conductor wall 50 includes the end portion 502 shaped to be gradually reduced from the end, so that physical (structural) resistance of the conductor wall 50 against pressure applied from the outside of the conductor wall 50 when the insulating resin 60 is provided is increased.

In addition, in this configuration, the conductor wall 50 is between the electronic component 411 and the connector 30. As a result, noise radiated from the electronic component 411 is significantly reduced or prevented from being propagated to the connector 30. Therefore, even when the electronic component 411 and the connector 30 are close to each other, an effect of the noise radiated from the electronic component 411 on a connection portion of the connector 30 is able to significantly reduced or prevented.

In other words, according to the present embodiment, the space with the opening portion is around the connector, and the conductor wall different from the shield film provided in the electronic component module is provided. With such a configuration, a conductor wall to significantly reduce or prevent the effect of electromagnetic waves on the connector does not need to be configured from the shield film applied to the entire electronic component module. Therefore, an effective shield state is able to be achieved by a simple process.

[First Mode of Connection to Outside]

Figure 2:
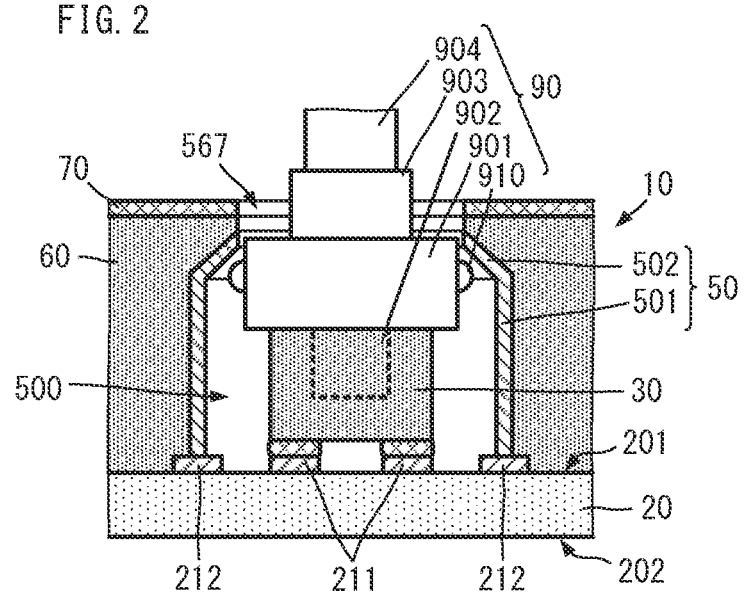
FIG. 2 is an expanded cross-sectional view showing a connection structure between the electronic component module according to the first embodiment and another connector member.

The electronic component module 10 with such a configuration is connected to another circuit board or the like, for example, as follows. FIG. 2 is an expanded cross-sectional view showing a connection structure between the electronic component module according to the first embodiment and another connector member.

As shown in FIG. 2, a connector member 90 is connected to the connector 30. The connector member 90 includes a base portion 901, a connection portion 902, a root portion 903, and a cable 904. The base portion 901 is shaped to fit in the opening 567. The connection portion 902 and the root portion 903 are connected to the base portion 901. The connection portion 902 and the root portion 903 are connected to each other on the opposite sides with respect to the base portion 901.

The connection portion 902 includes a connection terminal and has a shape capable of being fitted or connected to the connector 30. The root portion 903 is connected to the cable 904.

In such a configuration, the base portion 901 includes a protruding portion 910. The protruding portion 910 is shaped to protrude from a side surface of the base portion 901. The side surface of the base portion 901 is a surface perpendicular or substantially perpendicular to a surface to which the connection portion 902 and the root portion 903 are connected.

The protruding portion 910 is an elastic body, for example. The protruding portion 910 has a shape in which the outer shape of the base portion 901 including the protruding portion 910 is larger than the opening 567.

According to such a configuration, even when an external pulling force is applied to the connector member 90 while the connector member 90 is connected to the connector 30, the end portion 502 of the conductor wall 50 is shaped to be gradually reduced from the end near the main portion 501, so that the protruding portion 910 contacts an inner surface of the end portion 502 of the conductor wall 50. As a result, the connector member 90 is able to be significantly reduced or prevented from being detached from the connector 30.

It is to be noted that the protruding portion 910 being an elastic body is reduced in size by compression. Therefore, the connector member 90, when being put in the interior space of the conductor wall 50, is compressed by an inner wall of the opening 567 and is able to be put in the interior space of the conductor wall 50.

[Manufacturing Method]

The electronic component module 10 configured as described above is able to be manufactured by the following manufacturing method, for example. FIG. 3 is a flow chart showing a method of manufacturing the electronic component module according to the first embodiment of the present disclosure. FIG. 4A, FIG. 4B, FIG. 4C, and FIG. 4D are enlarged views of a side cross-section showing a shape in which a connector is located in predetermined steps of a manufacturing method shown in FIG. 3.

Figure 4A:
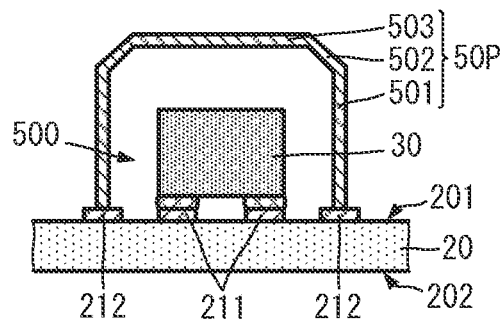
FIG. 4A, FIG. 4B, FIG. 4C, and FIG. 4D are enlarged views of a side cross-section showing a shape in which a connector is located in predetermined steps of a manufacturing method shown in FIG. 3.

First, as shown in FIG. 4A, a connector 30 and a cover member 50P are mounted on the first main surface 201 of the substrate 20 (S11 in FIG. 3). The cover member 50P has a shape in which a lid portion 503 is added to the conductor wall 50. The lid portion 503 is connected to an end of the end portion 502 opposite to an end of the end portion 502 to be connected to the main portion 501. The lid portion 503 closes a surface at the end of the end portion 502 opposite to the main portion 501. With such a lid portion 503, the cover member 50P is able to be easily mounted by a mounter or the like. It is to be noted that, in such a case, the electronic component 411 and the electronic component 412 are also mounted.

The substrate 20 is heat-treated (reflow treated, for example) in this state (S12 in FIG. 3). As a result, the connector 30 is bonded to the land conductor 211, and the cover member 50P is bonded to the land conductor 212. It is to be noted that, in such a case, the electronic component 411 is also bonded to the land conductor 221, and the electronic component 412 is also bonded to the land conductor 222.

Figure 4B:
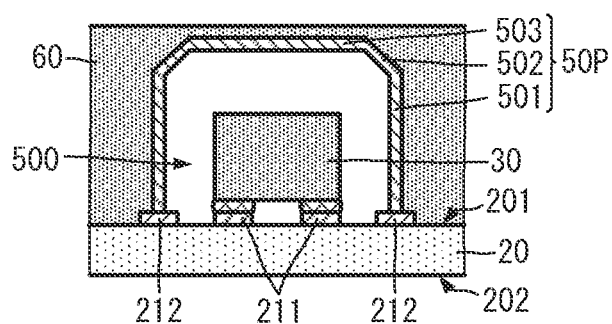

Next, the insulating resin 60 is applied to the side of the first main surface 201 of the substrate 20. In such a case, as shown in FIG. 4B, the insulating resin 60 is applied so as to cover the entire cover member 50P (S13 in FIG. 3). At such a time, the electronic component 411 and the electronic component 412 are also covered with the insulating resin 60. Then, the insulating resin is cured by heat or the like (S14 in FIG. 3).

Figure 4C:
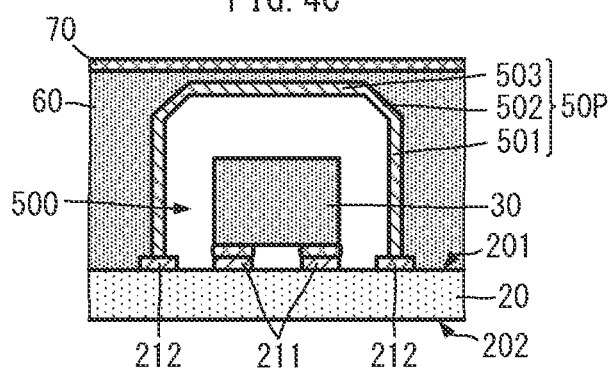

Subsequently, as shown in FIG. 4C, the shield film 70 is provided by sputtering or the like so as to cover the surface of the insulating resin 60 (S15 in FIG. 3).

Figure 4D:
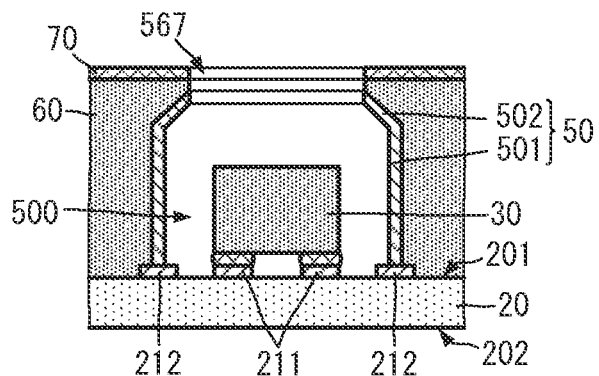

Next, as shown in FIG. 4D, the shield film 70, the insulating resin 60, and the lid portion 503 of the cover member 50P that are above the connector 30 are removed by a laser or the like, which provides the opening 567 (S16 in FIG. 3).

By using such a manufacturing method, the electronic component module 10 structured as discussed above is able to be easily manufactured.

[Second Mode of Connection to Outside]

Figure 5:
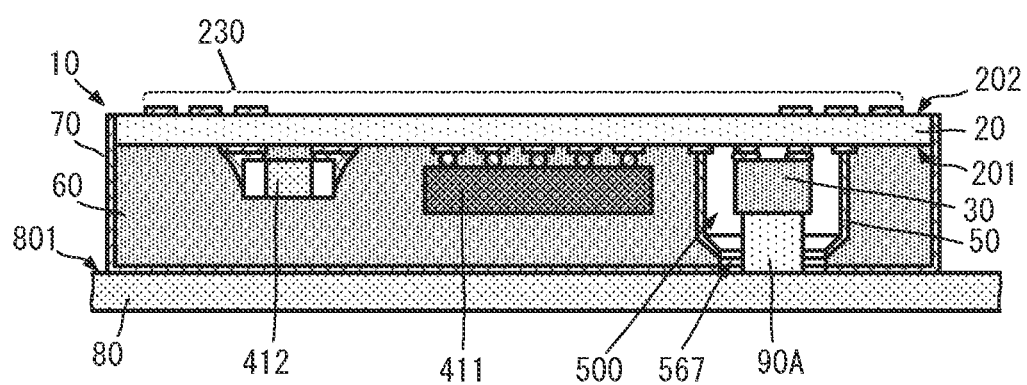
FIG. 5 is a side cross-sectional view showing a configuration in which the electronic component module is mounted on an external circuit board.

In the first mode of connection to the outside, the cable 904 connects the electronic component module 10 to the outside. However, the electronic component module 10 may be directly mounted on an external circuit board. FIG. 5 is a side cross-sectional view showing a configuration in which the electronic component module is mounted on an external circuit board.

A circuit board 80 on the outside includes a main surface 801. In addition, on the circuit board 80, for example, an electronic component to achieve a main control portion of a communication device including the electronic component module 10 is mounted, or a conductor pattern to achieve the main control portion is provided. The connector member 90A is mounted on the main surface 801.

The electronic component module 10 is disposed on the circuit board 80 so that the first main surface 201 faces the main surface 801 of the circuit board 80. Then, the connector 30 is fitted and electrically connected to the connector member 90A. As a result, the electronic component module 10 is physically fixed and electrically connected to the circuit board 80.

Second Embodiment

Figure 6:
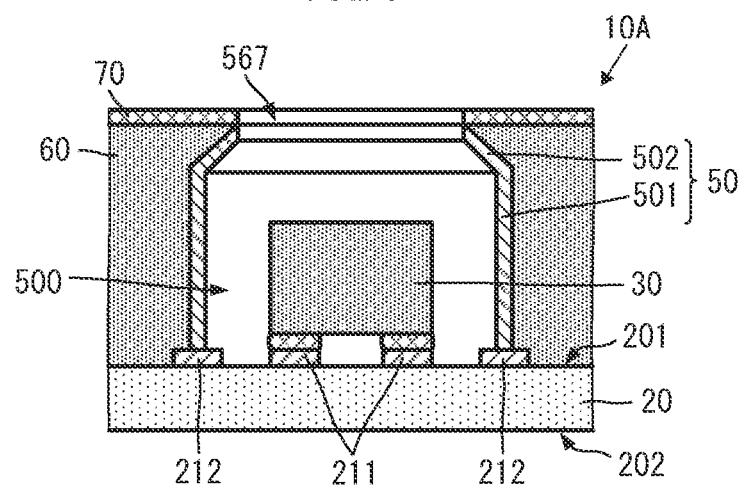
FIG. 6 is a side cross-sectional view in which a portion of the connector in an electronic component module according to a second embodiment of the present disclosure is enlarged.

An electronic component module according to a second embodiment of the present disclosure will be described with reference to drawings. FIG. 6 is a side cross-sectional view in which a portion of the connector in an electronic component module according to the second embodiment is enlarged.

[Configuration of Electronic Component Module 10A]

An electronic component module 10A according to the second embodiment is different in a configuration of a connector 30 shown in FIG. 6 from the electronic component module 10 according to the first embodiment. Other configurations of the electronic component module 10A are the same as or similar to the configurations of the electronic component module 10, and a description of the same or similar configuration will be omitted.

As shown in FIG. 6, the end portion 502 of the conductor wall 50 is connected to the shield film 70 in the electronic component module 10A. With this configuration, when the shield film 70 is grounded, for example, the conductor wall 50 is also more reliably grounded and a shield property is also improved.

[Manufacturing Method]

The electronic component module 10A of such a configuration is manufactured as follows, for example. FIG. 7 is a flow chart showing a method of manufacturing the electronic component module according to the second embodiment. FIG. 8A, FIG. 8B, FIG. 8C, FIG. 8D, and FIG. 8E are enlarged views of a side cross-section showing a shape in which a connector is located in predetermined steps of a manufacturing method shown in FIG. 7.

As shown in step S11 to step S14 of FIG. 7, FIG. 8A, and FIG. 8B, steps until when the insulating resin 60 is cured is the same as the steps of the first embodiment, and a description will be omitted.

After the insulating resin 60 is cured, the insulating resin 60 is partially removed (S21 in FIG. 7). Specifically, as shown in FIG. 8C, the insulating resin 60 is removed until the lid portion 503 of the cover member 50P is exposed.

Subsequently, as shown in FIG. 8D, the shield film 70 is provided by sputtering or the like so as to cover the surface of the insulating resin 60 and the lid portion 503 of the cover member 50P (S15 in FIG. 7).

Next, as shown in FIG. 8E, the shield film 70, and the lid portion 503 of the cover member 50P that are above the connector 30 are removed by a laser or the like, which provides the opening 567 (S22 in FIG. 7).

By using such a manufacturing method, the electronic component module 10A structured as discussed above is able to be easily manufactured.

Third Embodiment

Figure 9:
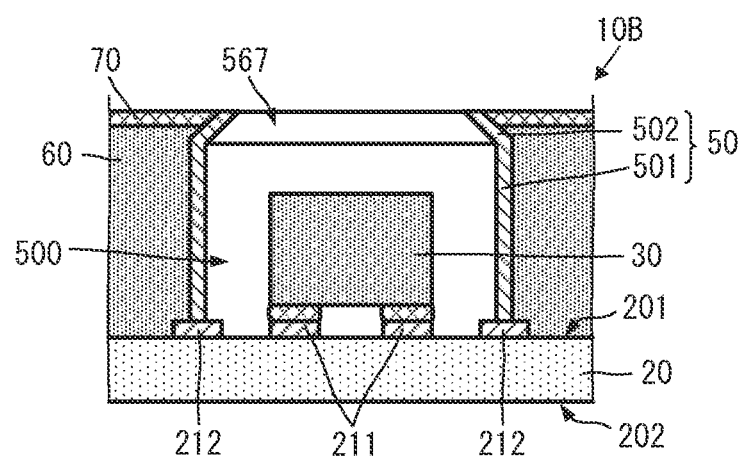
FIG. 9 is a side cross-sectional view showing an enlarged connector in an electronic component module according to a third embodiment of the present disclosure.

An electronic component module according to a third embodiment of the present disclosure will be described with reference to drawings. FIG. 9 is a side cross-sectional view showing an enlarged connector in an electronic component module according to the third embodiment of the present disclosure.

[Configuration of Electronic Component Module 10B]

An electronic component module 10B according to the third embodiment is different in a configuration of a connector 30 shown in FIG. 9 from the electronic component module 10 according to the first embodiment. Other configurations of the electronic component module 10B are the same as or similar to the configurations of the electronic component module 10, and a description of the same or similar configuration will be omitted.

As shown in FIG. 9, the end portion 502 of the conductor wall 50 is connected to the shield film 70 in the electronic component module 10B. In addition, an end surface to the outside at the end portion 502 and a surface of the shield film 70 are flush or substantially flush with each other. With this configuration, when the shield film 70 is grounded, for example, the conductor wall 50 is also more reliably grounded and the shield property is also improved. In addition, in comparison with the electronic component module 10A according to the second embodiment, a height of the electronic component module 10B is able to be reduced.

Fourth Embodiment

Figure 10:
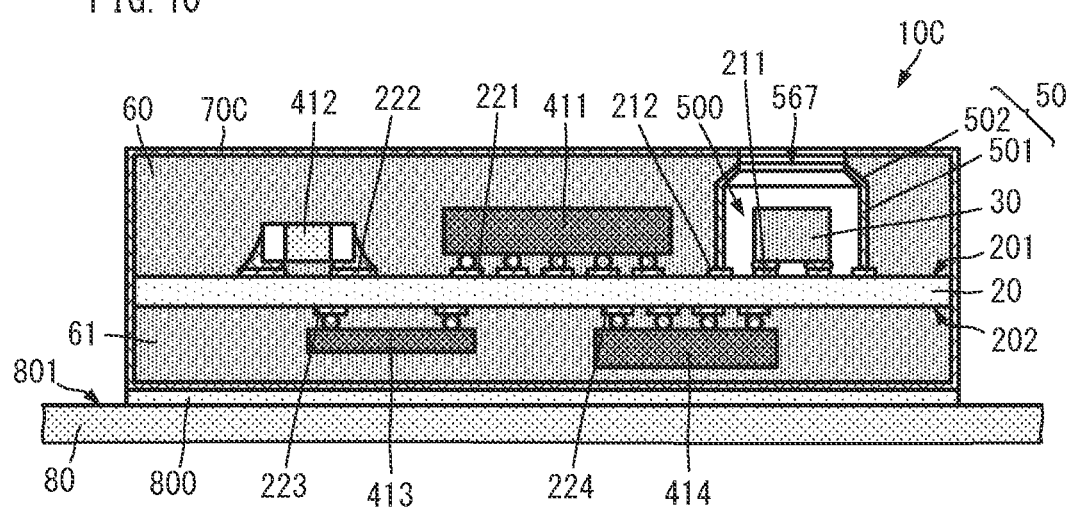
FIG. 10 is a side cross-sectional view showing a configuration of an electronic component module according to a fourth embodiment of the present disclosure.

An electronic component module according to a fourth embodiment of the present disclosure will be described with reference to drawings. FIG. 10 is a side cross-sectional view showing a configuration of an electronic component module according to the fourth embodiment of the present disclosure.

[Configuration of Electronic Component Module 10C]

As shown in FIG. 10, the electronic component module 10C according to the fourth embodiment is different in a structure on a side of the second main surface 202 of the substrate 20 from the electronic component module 10 according to the first embodiment. Other configurations of the electronic component module 10C are the same as or similar to the configurations of the electronic component module 10, and a description of the same or similar configuration will be omitted.

The electronic component module 10C, in comparison with the electronic component module 10, does not include the antenna conductor 230 and further includes an electronic component 413, an electronic component 414, an insulating resin 61, and a shield film 70C.

A land conductor 223 and a land conductor 224 are provided on the second main surface of the substrate 20. The electronic component 413 is mounted on the land conductor 223, and the electronic component 414 is mounted on the land conductor 224. The insulating resin 61 covers the entire second main surface 202 of the substrate 20, including the electronic component 413 and the electronic component 414. The shield film 70C covers surfaces of the insulating resin 60 and the insulating resin 61, and side surfaces of the substrate 20.

In such a configuration, the electronic component module 10C is installed on the circuit board 80, for example, so that the second main surface 202 faces the main surface 801 of the circuit board 80. The electronic component module 10C is adhered to the main surface 801 of the circuit board 80 with a double-sided tape 800.

As described above, the structure of a portion of the connector 30 is also employed to the electronic component module 10C that is mounted on both surfaces of the substrate 20. Then, the electronic component module 10C is able to be connected to the circuit board 80 through a connector member such as a cable to be connected to the connector 30.

[Derived Examples of Connector Member]

Figure 11A:
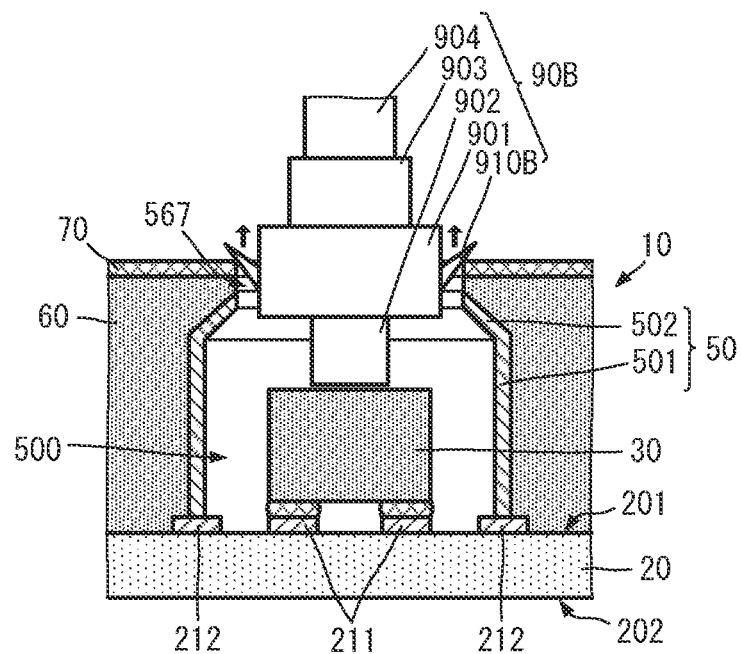
FIG. 11A and FIG. 11B are enlarged views of a side cross section showing a configuration according to a first derived example of a connector member to be connected to the electronic component module from outside.
Figure 11B:
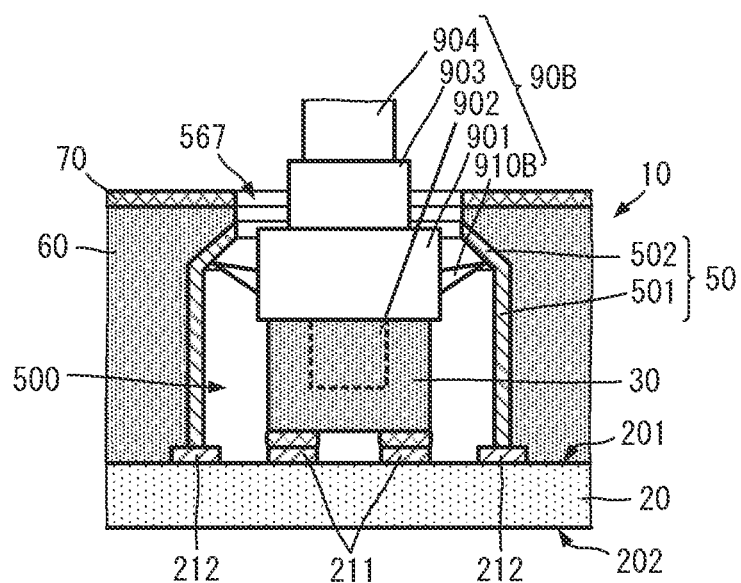
Figure 12A:
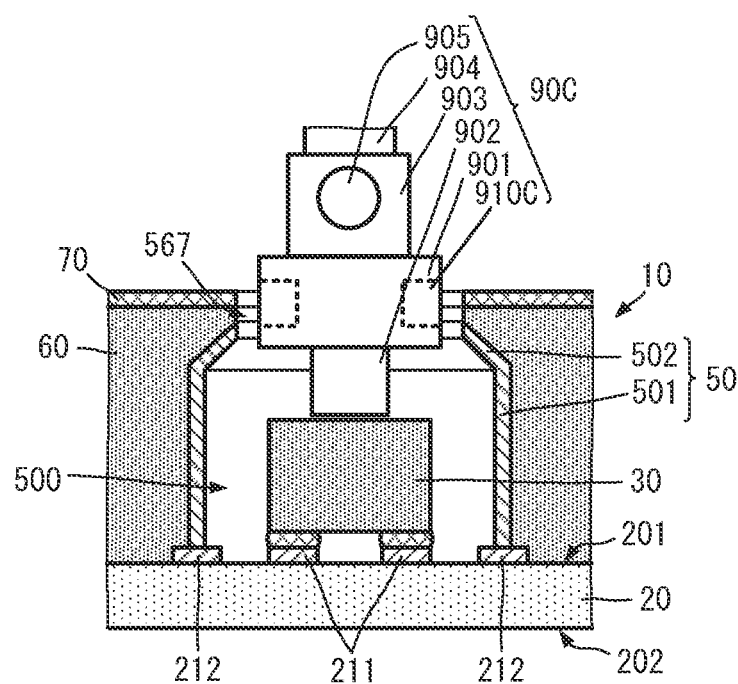
FIG. 12A and FIG. 12B are enlarged views of a side cross section showing a configuration according to a second derived example of the connector member to be connected to the electronic component module from the outside.
Figure 12B:
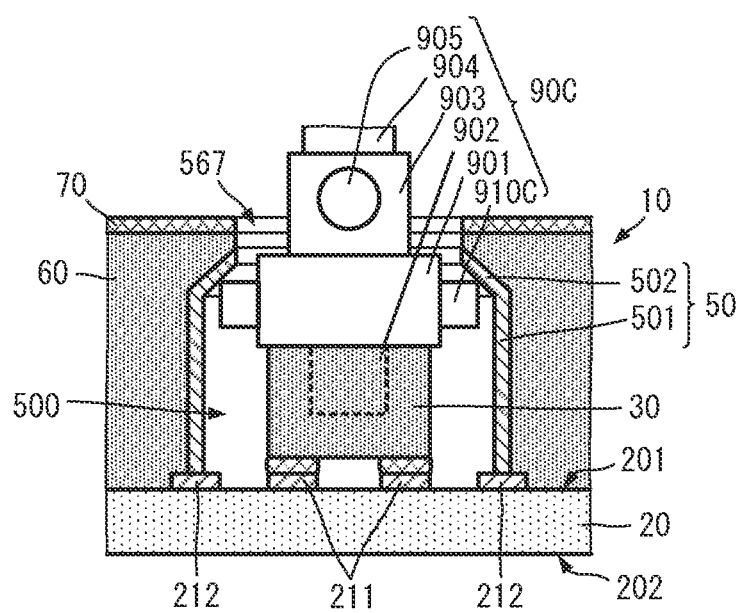

In the foregoing description, the connector member 90 to be connected to the connector 30 includes the protruding portion 910 being an elastic body. However, the connector member may be configured as follows. FIG. 11A and FIG. 11B are enlarged views of a side cross section showing a configuration according to a first derived example of the connector member to be connected to the electronic component module from the outside. FIG. 12A and FIG. 12B are enlarged views of a side cross section showing a configuration according to a second derived example of the connector member to be connected to the electronic component module from the outside.

[First Derived Example]

As shown in FIG. 11A and FIG. 11B, a connector member 90B is different from the connector member 90 in a structure of a protruding portion 910B. Other configurations of the connector member 90B are the same as or similar to the configurations of the connector member 90, and a description of the same or similar configuration will be omitted.

The protruding portion 910B of the connector member 90B is movable with respect to the base portion 901. Specifically, a tip of the protruding portion 910B is movable in a direction from the base portion 901 to the root portion 903 by an external force. On the other hand, the tip of the protruding portion 910B does not move by a predetermined amount or more in a direction from the base portion 901 to the connection portion 902.

In such a configuration, in a case in which the connector member 90B is put in the interior space 500 of the conductor wall 50 from the outside, as shown in FIG. 11A, the protruding portion 910B moves, and the tip of the protruding portion 910B approaches the side surface of the base portion 901. As a result, the connector member 90B is able to be easily put in the interior space 500 through the opening 567.

In contrast, when the connector member 90B is attempted to be pulled out from the interior space 500 to the outside, the protruding portion 910B contacts and gets caught in the inner surface of the end portion 502 of the conductor wall 50. As a result, the connector member 90B is significantly reduced or prevented from being pulled out from the interior space 500 to the outside.

[Second Derived Example]

As shown in FIG. 12A and FIG. 12B, a connector member 90C is different from the connector member 90 in a structure of a protruding portion 910C and is also different in that a button 905 is provided. Other configurations of the connector member 90C are the same as or similar to the configurations of the connector member 90, and a description of the same or similar configuration will be omitted.

The protruding portion 910C of the connector member 90C is movable with respect to the base portion 901. Specifically, the protruding portion 910C is switched by an operation of the button 905 between a state of being accommodated inside the base portion 901 and a state of protruding to the outside of the base portion 901.

In such a configuration, in a case in which the connector member 90C is put in the interior space 500 of the conductor wall 50 from the outside, as shown in FIG. 12A, the protruding portion 910C is accommodated in the base portion 901. As a result, the connector member 90C is able to be easily put in the interior space 500 through the opening 567.

Then, while the connector member 90C is connected to the connector 30, the protruding portion 910C is made to protrude from the base portion 901 by the operation of the button 905. In such a state, when the connector member 90C is attempted to be pulled out from the interior space 500 to the outside, the protruding portion 910C contacts and gets caught in the inner surface of the end portion 502 of the conductor wall 50. As a result, the connector member 90C is significantly reduced or prevented from being pulled out from the interior space 500 to the outside.

It is to be noted that the configuration of the protruding portion is not limited to the above configuration, the shape of the protruding portion is able to be changed, and any configuration that is able to maintain a predetermined shape is able to be employed for the connector member in the present disclosure.

In addition, the configurations described in the above embodiments are able to be appropriately combined, and the advantageous functions and effects according to each combination are able to be obtained.

REFERENCE SIGNS LIST 10, 10A, 10B, 10C: electronic component module
20: substrate
30: connector
50: conductor wall
50P: cover member
60, 61: insulating resin
70, 70C: shield film
80: circuit board
90, 90A, 90B, 90C: connector member
201: first main surface
202: second main surface
211, 212, 221, 222, 223, 224: land conductor
230: antenna conductor
411, 412, 413, 414: electronic component
500: interior space
501: main portion
502: end portion
503: lid portion
567: opening
800: double-sided tape
801: main surface
901: base portion
902: connection portion
903: root portion
904: cable
905: button
910, 910B, 910C: protruding portion

The invention claimed is:
1. An electronic component module comprising:
a substrate having a first main surface;
an electronic component mounted on the first main surface of the substrate;

a mount component mounted on the first main surface of the substrate;
a first insulating resin on the first main surface of the substrate;
a conductive shield film on a surface of the first insulating resin; and
a conductor wall separating the mount component and the electronic component, wherein:
the conductor wall has an opening and includes an interior space that is not covered by an insulating resin;
the mount component is in the interior space;
the first insulating resin covers the entire first main surface except the interior space of the opening of the conductor wall; and
an area of the opening on a side opposite to a side mounted on the substrate is smaller than a planar cross-sectional area at a same height as the mount component.

2. The electronic component module according to claim 1, wherein, over an entire periphery of the opening, a position on the conductor wall at the opening on the side opposite to the side mounted on the substrate is closer to a center of the opening than a position on the conductor wall at the same height as the mount component.

3. The electronic component module according to claim 2, wherein the conductor wall and the conductive shield film are in contact with each other.

4. The electronic component module according to claim 2, wherein the mount component is a terminal connector for external connection.

5. The electronic component module according to claim 2, further comprising:
an antenna conductor, wherein:
the substrate has a second main surface that faces the first main surface, and
the antenna conductor is on the second main surface.

6. The electronic component module according to claim 2, further comprising:
additional electronic components; and
a second insulating resin, wherein:
the substrate has a second main surface that faces the first main surface, and
the additional electronic components are mounted on the second main surface, and the second insulating resin covers the additional electronic components.

7. The electronic component module according to claim 1, wherein the conductor wall and the conductive shield film are in contact with each other.

8. The electronic component module according to claim 7, wherein the mount component is a terminal connector for external connection.

9. The electronic component module according to claim 7, further comprising:
an antenna conductor, wherein:
the substrate has a second main surface that faces the first main surface, and
the antenna conductor is on the second main surface.

10. The electronic component module according to claim 7, further comprising:
additional electronic components; and
a second insulating resin, wherein:
the substrate has a second main surface that faces the first main surface, and
the additional electronic components are mounted on the second main surface, and the second insulating resin covers the additional electronic components.

11. The electronic component module according to claim 1, wherein the mount component is a terminal connector for external connection.

12. The electronic component module according to claim 11, further comprising:
an antenna conductor, wherein:
the substrate has a second main surface that faces the first main surface, and
the antenna conductor is on the second main surface.

13. The electronic component module according to claim 11, further comprising:
additional electronic components; and
a second insulating resin, wherein:
the substrate has a second main surface that faces the first main surface, and
the additional electronic components are mounted on the second main surface, and the second insulating resin covers the additional electronic components.

14. The electronic component module according to claim 1, further comprising:
an antenna conductor, wherein:
the substrate has a second main surface that faces the first main surface, and
the antenna conductor is on the second main surface.

15. The electronic component module according to claim 1, further comprising:
additional electronic components; and
a second insulating resin, wherein:
the substrate has a second main surface that faces the first main surface, and
the additional electronic components are mounted on the second main surface, and the second insulating resin covers the additional electronic components.

* * * * *